(12) United States Patent
Tsujikawa

(10) Patent No.: US 10,460,433 B2
(45) Date of Patent: Oct. 29, 2019

(54) MEASUREMENT METHOD, MEASUREMENT APPARATUS, LITHOGRAPHY APPARATUS, AND METHOD OF MANUFACTURING ARTICLE

(71) Applicant: CANON KABUSHIKI KAISHA, Tokyo (JP)

(72) Inventor: Takuro Tsujikawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 244 days.

(21) Appl. No.: 15/466,947

(22) Filed: Mar. 23, 2017

(65) Prior Publication Data

US 2017/0278233 A1    Sep. 28, 2017

(30) Foreign Application Priority Data

Mar. 25, 2016    (JP) ................................. 2016-062488

(51) Int. Cl.
*G06T 7/00*        (2017.01)
*G06T 7/33*        (2017.01)
(Continued)

(52) U.S. Cl.
CPC .......... *G06T 7/0004* (2013.01); *G03F 9/7011* (2013.01); *G06T 3/0068* (2013.01);
(Continued)

(58) Field of Classification Search
None
See application file for complete search history.

(56) References Cited

U.S. PATENT DOCUMENTS 6,188,467 B1    2/2001  Yamatsu et al.
6,985,209 B2    1/2006  Yoshida
(Continued)

FOREIGN PATENT DOCUMENTS

CN    105372946 A    3/2016
EP    0989596 A1    3/2000
(Continued)

OTHER PUBLICATIONS

Extended European Search Report issued in European Appln. No. 17159532.5 dated Dec. 4, 2017.
(Continued)

*Primary Examiner* — Kim Y Vu
*Assistant Examiner* — Nathan J Bloom
(74) *Attorney, Agent, or Firm* — Rossi, Kimms & McDowell LLP

(57) ABSTRACT

The present invention provides a measurement method of measuring a rotational shift amount of pattern regions arranged on a substrate with respect to a reference portion provided at an outer edge of the substrate, including obtaining a first image by capturing a target region including a target object on the substrate during detecting a position of the reference portion while rotating the substrate, obtaining a second image by capturing the target object in a state in which the substrate remains still, obtaining a third image indicating a difference between the first image and the second image by correcting the second image with the first image, and obtaining a position of the target object based on the third image and obtaining the rotational shift amount of the pattern regions with respect to the reference portion based on the obtained position of the target object.

11 Claims, 6 Drawing Sheets

US 10,460,433 B2
Page 2

(51) Int. Cl.
  *G06T 3/00* (2006.01)
  *G06T 3/60* (2006.01)
  *G06T 7/11* (2017.01)
  *G03F 9/00* (2006.01)

(52) U.S. Cl.
  CPC .............. *G06T 3/60* (2013.01); *G06T 7/11* (2017.01); *G06T 7/33* (2017.01); *G06T 2207/30148* (2013.01)

(56) References Cited

U.S. PATENT DOCUMENTS

| | | |
|---|---|---|
| 8,043,652 B2 | 10/2011 | Eby et al. |
| 9,488,815 B2 | 11/2016 | Miyamoto et al. |
| 2003/0025891 A1 | 2/2003 | Hoogenraad et al. |
| 2006/0083420 A1* | 4/2006 | Kawaguchi .......... G01N 21/956 382/149 |
| 2006/0181700 A1* | 8/2006 | Andrews ................ G01N 21/21 356/237.2 |
| 2007/0263197 A1 | 11/2007 | Luttikhuis et al. |
| 2008/0013089 A1* | 1/2008 | Ishii ..................... G03F 9/7011 356/400 |
| 2008/0144922 A1 | 6/2008 | Naiki |
| 2010/0283847 A1* | 11/2010 | Aikawa ............... G01N 21/8803 348/142 |
| 2011/0194753 A1* | 8/2011 | Kamiyama ........ G01N 21/8851 382/149 |
| 2014/0044339 A1* | 2/2014 | Onozaki ............... G02B 6/2551 382/141 |
| 2016/0180517 A1* | 6/2016 | Fuchs ....................... G06T 7/11 382/144 |
| 2017/0171464 A1* | 6/2017 | Liu ......................... H04N 5/772 |
| 2017/0256466 A1* | 9/2017 | Bishop .................... G06T 7/001 |

FOREIGN PATENT DOCUMENTS

| | | |
|---|---|---|
| EP | 1098360 A1 | 5/2001 |
| JP | S63-104349 A | 5/1988 |
| JP | 2006041387 A | 2/2006 |
| TW | 200304540 A | 10/2003 |
| TW | 200830063 A | 7/2008 |
| TW | 201346983 A | 11/2013 |

OTHER PUBLICATIONS

Office Action issued in Taiwanese Appln. No. 106107816 dated Mar. 20, 2018. English translation provided.

* cited by examiner

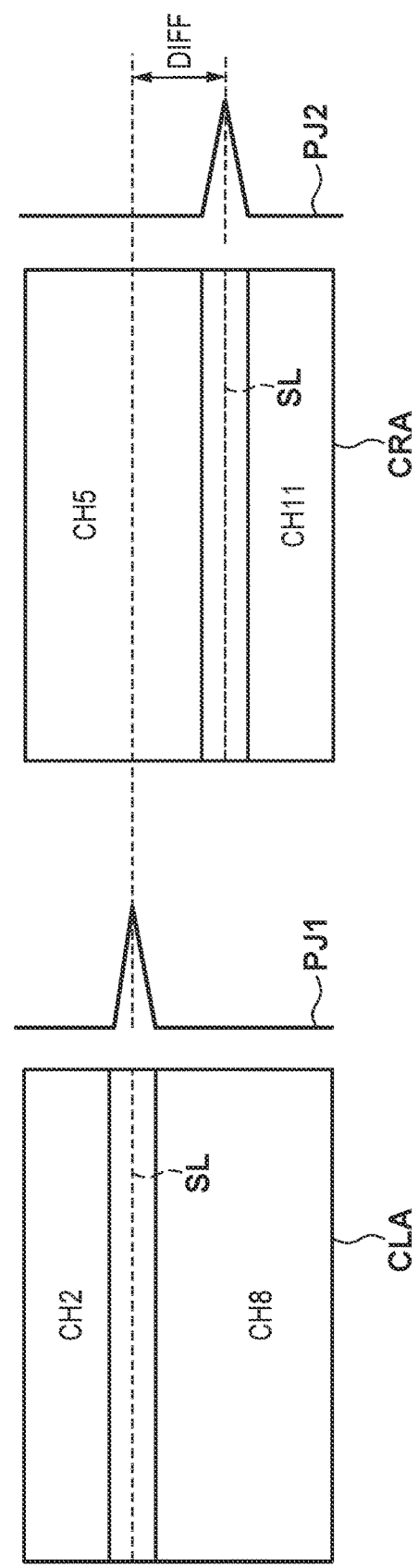

MEASUREMENT METHOD, MEASUREMENT APPARATUS, LITHOGRAPHY APPARATUS, AND METHOD OF MANUFACTURING ARTICLE

BACKGROUND OF THE INVENTION

Field of the Invention

The present invention relates to a measurement method, a measurement apparatus, a lithography apparatus, and a method of manufacturing an article.

Description of the Related Art

An exposure apparatus which projects a reticle pattern on a substrate such as a wafer via a projection optical system and transfers the pattern is used as a lithography apparatus which manufactures a device such as a semiconductor device, a liquid crystal display device, a thin-film magnetic head, or the like. In general, such an exposure apparatus detects a notch which is provided in a substrate conveyed into the apparatus and corrects a substrate position relative to the notch on a pre-alignment stage before sending the substrate to a substrate stage. This makes it possible to position an alignment mark which is provided on the substrate held by the substrate stage within the field of view of an alignment scope when the substrate is sent from the pre-alignment stage to the substrate stage.

On the other hand, for example, on a reconstruction substrate in FOWLP (Fan Out Wafer-Level-Packaging) or the like in which individual chips are arranged in the substrate, an error (θ error) is often included at a θ (rotational direction) position between the notch and the average lattice of the chips. Note that the average lattice is an average line defined on the boundary (between the chips) of the chips (pattern regions) from the arrangement of the chips on the substrate and is also called a scribe line. In this case, even if the substrate position is corrected relative to the notch, the alignment mark provided on the substrate may fall outside the field of view of the alignment scope when the substrate is sent from the pre-alignment stage to the substrate stage.

It can be also considered that the field of view of the alignment scope is expanded to bring the alignment mark into the field of view. Even if the alignment mark can be detected, however, the stroke of the substrate stage in the rotational direction may lack when the rotational amount of the substrate is large. In this case, the substrate has to be detached from the substrate stage and sent to the substrate stage again, generating a time for transferring the substrate.

To cope with this, Japanese Patent Laid-Open No. 63-104349 proposes a technique of detecting a scribe line after detecting a notch, obtaining a θ error in the average lattice of chips with respect to the notch from that result, and rotating a substrate on a pre-alignment stage based on the θ error (correcting a θ position). However, the position of the scribe line to be detected changes depending on the shapes or arrangement of the chips. Therefore, the field of view of a scope for detecting the scribe line needs to be expanded in order to handle various substrates.

Wide-area illumination such as bar illumination is needed in order to detect the scribe line accurately in a wide field of view. In such illumination, it is known that illumination light for illuminating the scribe line has an area equal to or larger than a detection region (field of view) on the substrate. Light, out of illumination light, which illuminates a region other than the detection region on the substrate is reflected by the region, becomes stray light by being further reflected by a peripheral structure or the like, and causes a detection error by entering a scope. Therefore, Japanese Patent Laid-Open No. 2006-41387 proposes a technique of reducing the influence of the detection error caused by such stray light.

In the technique disclosed in Japanese Patent Laid-Open No. 2006-41387, a representative corrected image for capturing a non-mark region different from a mark region on an object in which a mark has been formed and removes the stray light is obtained (prepared) in advance. In practice, however, the influence (appearance) of the stray light changes for each difference in material (reflectance) of the substrate or orientation of the substrate held by the stage, making it impossible to reduce the influence of the stray light sufficiently in the representative corrected image obtained in advance. It is possible to reduce the influence of the stray light by obtaining the corrected image for each lot or for each substrate. Considering a time required to obtain the corrected images, however, it is not realistic from the viewpoint of throughput.

SUMMARY OF THE INVENTION

The present invention provides a measurement method advantageous in measuring the rotational shift amount of pattern regions arranged on a substrate.

According to one aspect of the present invention, there is provided a measurement method of measuring a rotational shift amount of pattern regions arranged on a substrate with respect to a reference portion provided at an outer edge of the substrate, the method including obtaining a first image by capturing a target region including a target object on the substrate during detecting a position of the reference portion while rotating the substrate, obtaining a second image by capturing the target object in a state in which the substrate remains still, obtaining a third image indicating a difference between the first image and the second image by correcting the second image with the first image, and obtaining a position of the target object based on the third image and obtaining the rotational shift amount of the pattern regions with respect to the reference portion based on the obtained position of the target object.

Further aspects of the present invention will become apparent from the following description of exemplary embodiments with reference to the attached drawings.

BRIEF DESCRIPTION OF THE DRAWINGS

FIG. 5 is a view for explaining a method of obtaining a θ error in the average lattice of chip regions with respect to a notch.

DESCRIPTION OF THE EMBODIMENTS

Figure 1:
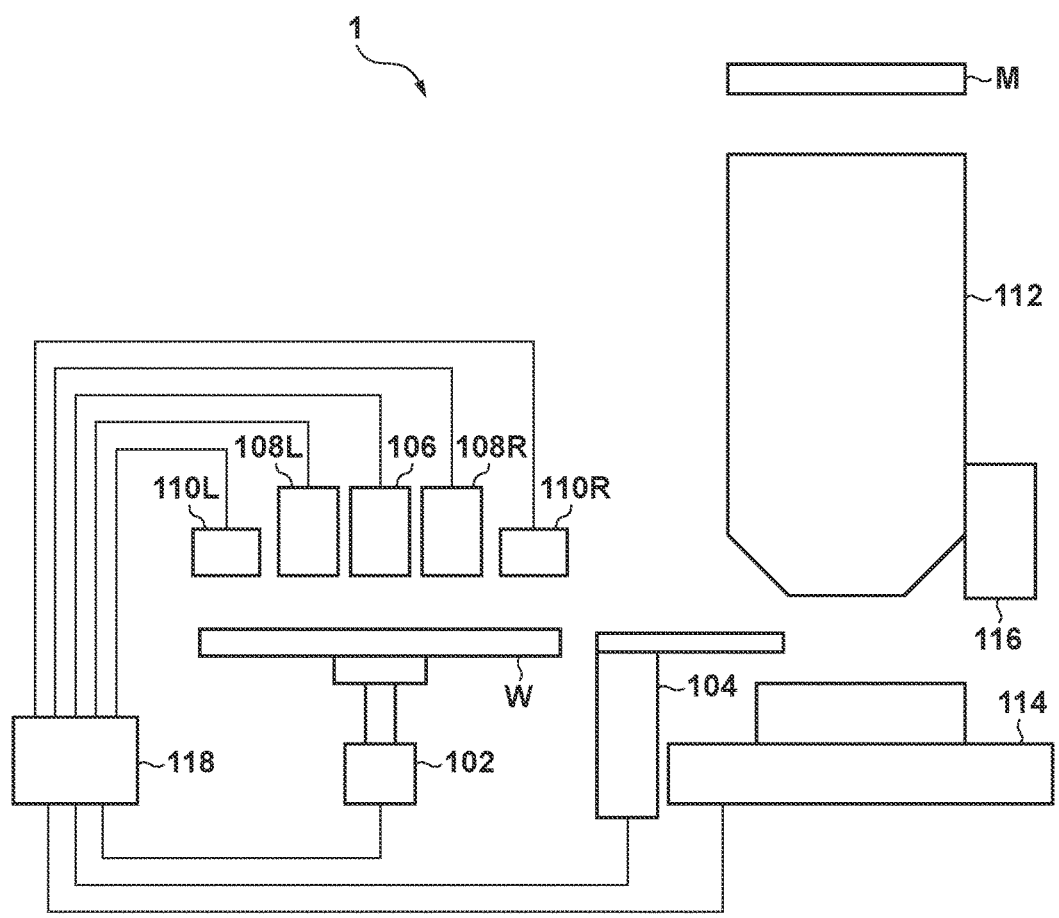
FIG. 1 is a schematic view showing the arrangement of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

<First Embodiment>

FIG. 1 is a schematic view showing the arrangement of an exposure apparatus 1 according to an aspect of the present invention. The exposure apparatus 1 is a lithography apparatus which exposes a substrate via a mask or a reticle (original) and forms a pattern. The exposure apparatus 1 includes a pre-alignment stage 102, a conveyance system 104 which conveys a substrate W, a first image capturing unit 106, second image capturing units 108R and 108L, and illumination units 110R and 110L. The exposure apparatus 1 also includes an illumination optical system (not shown) which illuminates a mask M, a projection optical system 112 which projects a pattern image of the mask M on the substrate W, a substrate stage 114 which holds the substrate W, an alignment scope 116, and a control unit 118.

The substrate W is loaded into the apparatus via the conveyance system 104 and held by the pre-alignment stage 102. The pre-alignment stage 102 has a function of holding and rotating the substrate W. Pre-alignment of the substrate W held by the pre-alignment stage 102 is performed under the control of the control unit 118.

The first image capturing unit 106 which captures an outer edge WE of the substrate W, and the second image capturing units 108R and 108L which capture a region WS on the substrate are arranged above the pre-alignment stage 102. The first image capturing unit 106, and the second image capturing units 108R and 108L include image sensors such as CMOS image sensors and CCD image sensors. The illumination units 110R and 110L configured to illuminate the respective image capturing regions of the second image capturing units 108R and 108L are arranged around the second image capturing units 108R and 108L, respectively. In this embodiment, the illumination units 110R and 110L implement wide-area illumination such as bar illumination.

Figure 2:
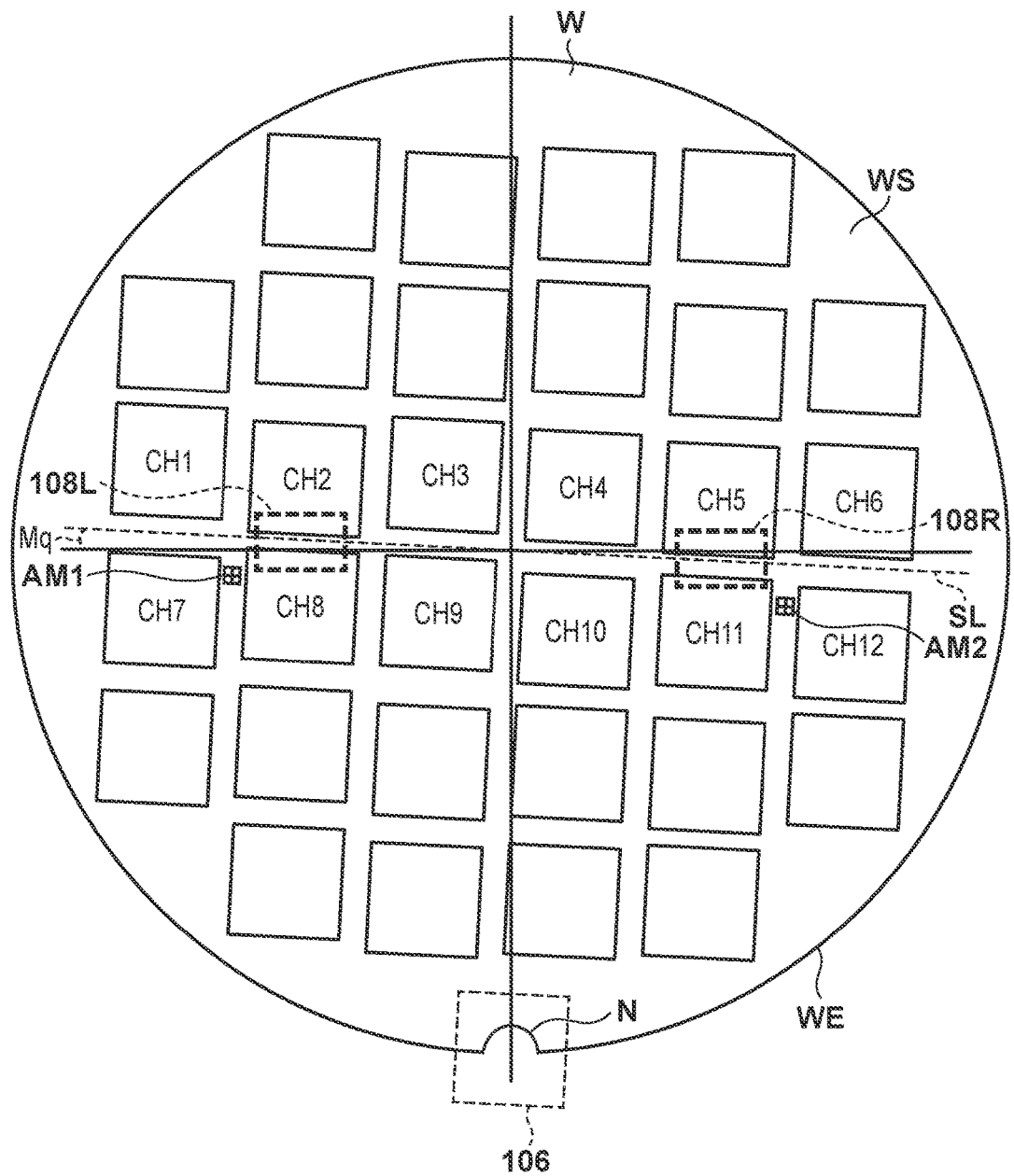
FIG. 2 is a plan view showing one example of a substrate loaded to the exposure apparatus shown in FIG. 1.

As shown in FIG. 2, a notch N is provided at the outer edge WE of the substrate W as a portion (reference portion) to be the positional reference of the substrate W in a rotational direction, and a plurality of chip regions (pattern regions) CH1 to CH12 are arranged two-dimensionally on the substrate. As described above, in this embodiment, a reconstruction substrate in FOWLP or the like in which individual chips are arranged on the substrate is assumed as the substrate W. Note that the reference portion provided at the outer edge WE of the substrate W is not limited to the notch N, but may be an orientation flat. In addition, the outer shape of the substrate W is a circle in FIG. 2, but may be a rectangle.

The illumination optical system includes a lens, a mirror, an optical integrator, a phase plate, a diffraction optical element, a stop, or the like and illuminates the mask M with light from a light source. A pattern that should be transferred onto the substrate W is formed in the mask M. The mask M and the substrate W are arranged at optically conjugate positions with respect to the projection optical system 112. Any optical systems of an equal-magnification imaging optical system, an enlarging imaging optical system, and a reducing imaging optical system are applicable to the projection optical system 112. For example, the substrate stage 114 includes a chuck which chucks the substrate W and can move while holding the substrate W. The alignment scope 116 detects a mark which is provided on the substrate W held by the substrate stage 114, for example, alignment marks AM1 and AM2.

The control unit 118 includes a CPU, a memory, and the like and controls the overall exposure apparatus 1. The control unit 118 comprehensively controls the respective units of the exposure apparatus 1 to control a process of exposing the substrate W, that is, a process of transferring the pattern of the mask M onto the substrate W. Note that the process of exposing the substrate W includes, for example, pre-alignment performed on the pre-alignment stage 102. In the pre-alignment, the control unit 118 functions as a processing unit which performs a process of obtaining the rotational shift amount of the chip regions CH1 to CH12 with respect to the notch N, as will be described later.

In general pre-alignment, the position of the notch N is detected from an image obtained by capturing, with the first image capturing unit 106, the outer edge WE of the substrate W held by the pre-alignment stage 102. Then, the conveyance system 104 sends the substrate W from the pre-alignment stage 102 to the substrate stage 114 after the position of the substrate W is corrected relative to the notch N. This makes it possible to position the alignment marks AM1 and AM2 which are provided on the substrate W held by the substrate stage 114 within the field of view of the alignment scope 116, that is, to detect them by the alignment scope 116.

If the reconstruction substrate is used as the substrate W, however, a θ position between the notch N and the average lattice of the chip regions CH1 to CH12 has a θ error (rotational shift amount) Mq, as shown in FIG. 2. Therefore, even if the position of the substrate W is corrected relative to the notch N, the alignment marks AM1 and AM2 are likely to fall outside the field of view of the alignment scope 116 when the substrate W is sent from the pre-alignment stage 102 to the substrate stage 114. Note that the average lattice is an average line (scribe line) SL defined among the chip regions CH1 to CH12 from the arrangement of the chip regions CH1 to CH12 on the substrate.

In this case, for example, as disclosed in Japanese Patent Laid-Open No. 63-104349, the θ error Mq in the average lattice of the chip regions CH1 to CH12 with respect to the notch N can be obtained, and the θ position can be corrected by rotating the substrate W on the pre-alignment stage based on the θ error Mq. More specifically, as shown in FIG. 5, the scribe line SL is captured by using the second image capturing units 108R and 108L, and the illumination units 110R and 110L after the notch N is detected, obtaining an image CRA by the second image capturing unit 108R and obtaining an image CLA by the second image capturing unit 108L. It is possible to obtain the θ error Mq by generating waveforms PJ2 and PJ1 by performing integration projection on the respective images CRA and CLA in a horizontal direction, and obtaining a shift amount DIFT in a vertical direction from the waveforms PJ2 and PJ1.

Figure 6:
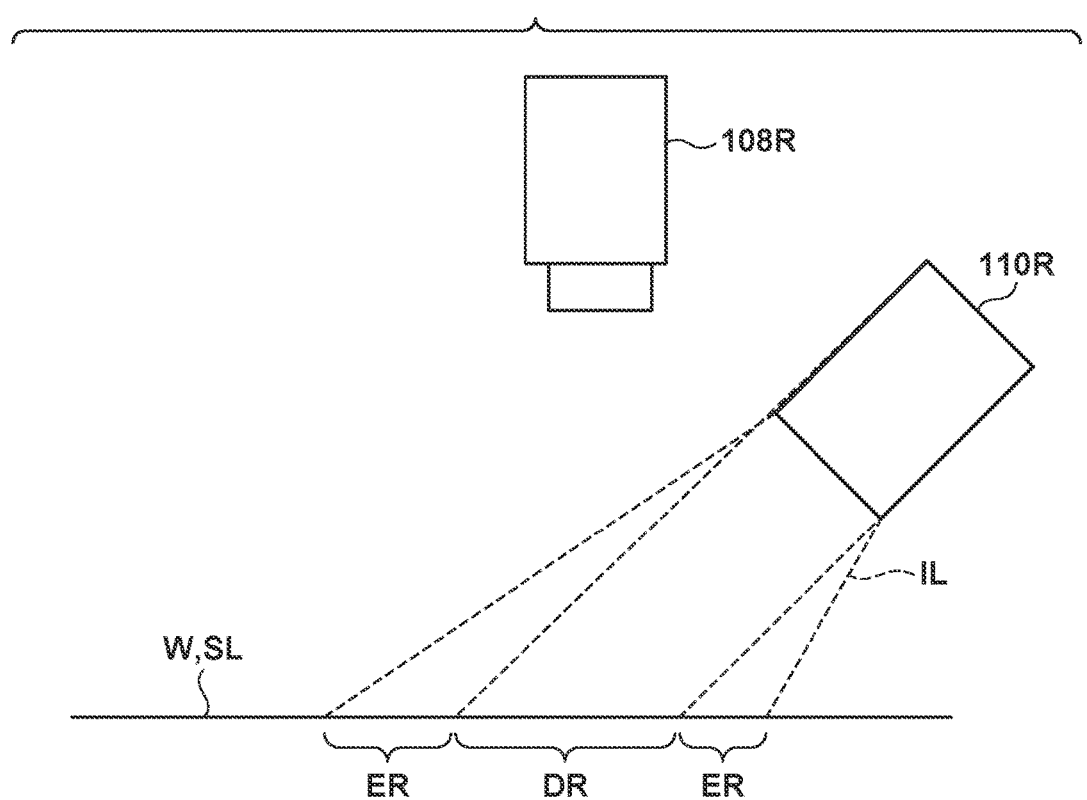
FIG. 6 is a view for explaining bar illumination serving as one example of wide-area illumination.

In this embodiment, the illumination units 110R and 110L implement the wire-area illumination, and more specifically, bar illumination in order to detect the scribe line SL accurately in a wide field of view. On the other hand, in bar illumination, illumination light IL for illuminating the scribe line SL spreads beyond a detection region (the image capturing region of the second image capturing unit 108R) DR on the substrate, as shown in FIG. 6. Light, out of the illumination light IL, which illuminates regions ER other than the detection region on the substrate is reflected by the regions ER, becomes stray light by being further reflected by a peripheral structure or the like, and causes a detection error by entering the second image capturing unit 108R. A description has been made here by taking the second image capturing unit 108R as an example. However, a detection error is similarly caused also in the second image capturing unit 108L.

Figure 3:
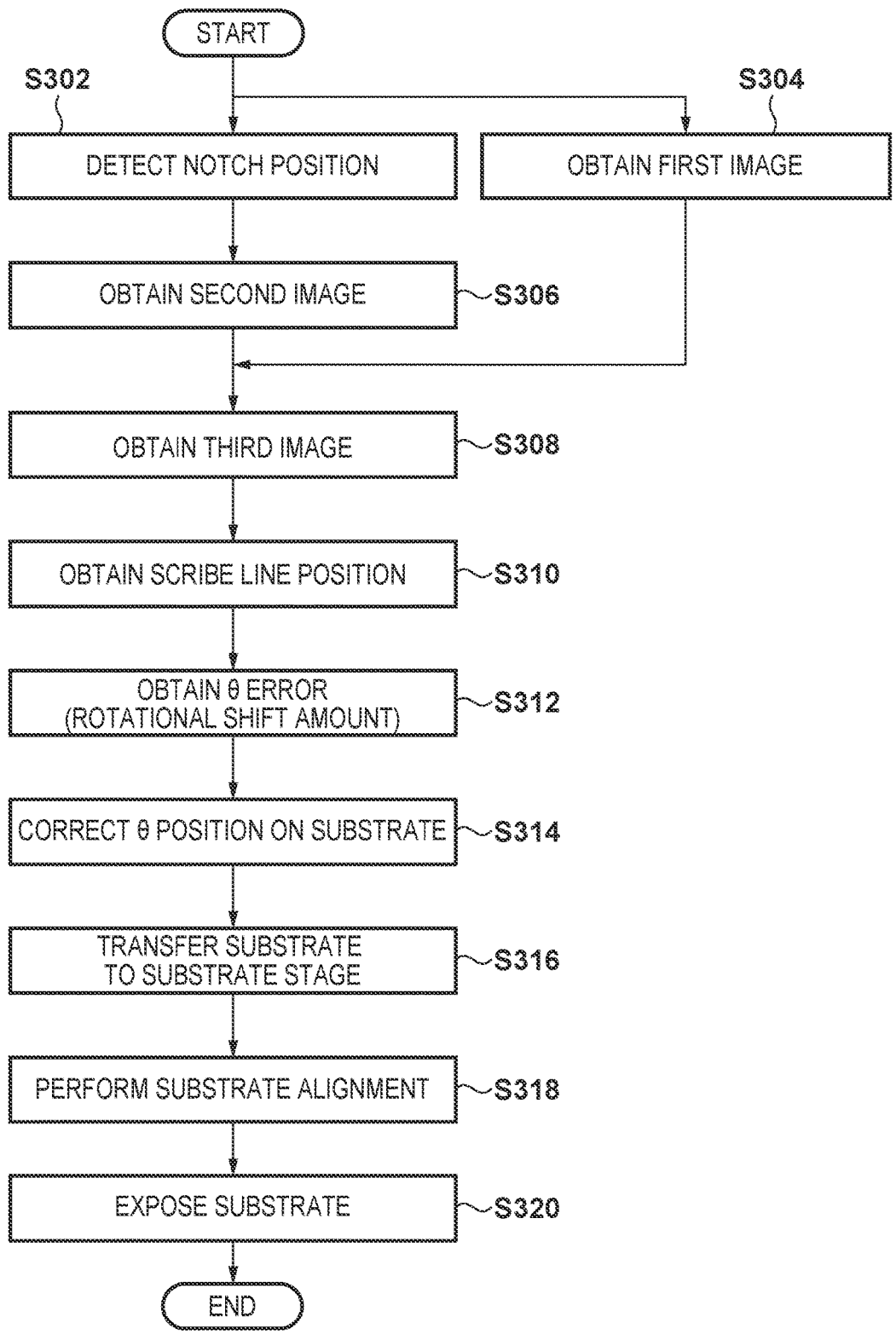
FIG. 3 is a flowchart for explaining an exposure process in the exposure apparatus shown in FIG. 1.

To cope with this, in this embodiment, the process (exposure process) of exposing the substrate W is performed while suppressing the influence of the detection error caused by such stray light, as will be described below. FIG. 3 is a flowchart for explaining the exposure process in the exposure apparatus 1. A process (measurement method) regarding measurement of the θ error Mq in the chip regions CH1 to CH12 with respect to the notch N will particularly be described in detail here.

In step S302, the position of the notch N provided at the outer edge WE of the substrate W is detected on the pre-alignment stage 102. More specifically, the first image capturing unit 106 captures the outer edge WE of the substrate W while rotating the pre-alignment stage 102 (the substrate W held thereby) to obtain an image, and the position of the notch N is detected from the image.

Figure 4A:
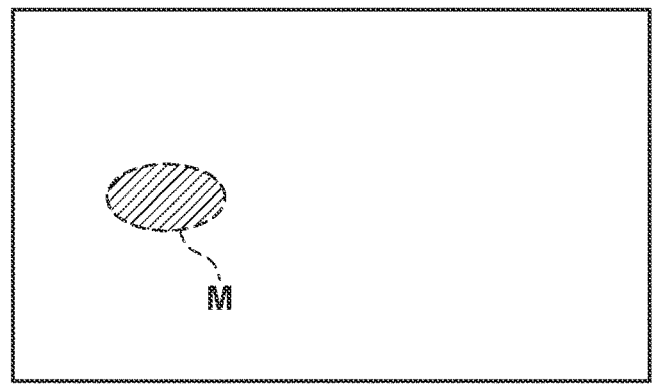
FIGS. 4A to 4C are views showing examples of images obtained in steps S304, S306, and S308, respectively, of the flowchart shown in FIG. 3.

In step S304, the first image for correcting the stray light is obtained in parallel with step S302 (detection of the position of the notch N). More specifically, the first image as shown in FIG. 4A is obtained by accumulating electricity continuously in the second image capturing units 108R and 108L while the substrate W is in bar illumination by the illumination units 110R and 110L in a state in which the pre-alignment stage 102 rotates the substrate W. In other words, one first image is obtained by capturing a target region on the substrate continuously while rotating the substrate W. At this time, stray light M does not follow the rotation of the substrate W, and thus a position captured (observed) by the second image capturing units 108R and 108L does not change. The image flows by rotating the substrate W, and thus the chip regions CH1 to CH12 (the pattern thereof) on the substrate are captured as averaged noise in the second image capturing units 108R and 108L where the electricity is accumulated continuously while rotating the substrate W. Therefore, the first image captured by the second image capturing units 108R and 108L while rotating the substrate W becomes an image in which only the stray light M exists, as shown in FIG. 4A.

As described above, in steps S302 and S304, the first image is obtained by capturing, with the second image capturing units 108R and 108L, the target region including a target object on the substrate, or the scribe line SL in this embodiment during detecting the position of the notch N while rotating the substrate W. Note that when the first image is obtained, the substrate W is preferably rotated at least once in order to average, for example, noise components of the chip regions CH1 to CH12 or the like other than the stray light.

In step S306, after the notch N is detected, the second image is obtained by capturing, with second image capturing units 108R and 108L, the scribe line SL serving as the target object on the substrate in a state in which the substrate W remains still. The substrate W does not rotate here, and thus the second image obtained by the second image capturing units 108R and 108L becomes an image in which the stray light M overlaps the scribe line SL, as shown in FIG. 4B.

Figure 4B:
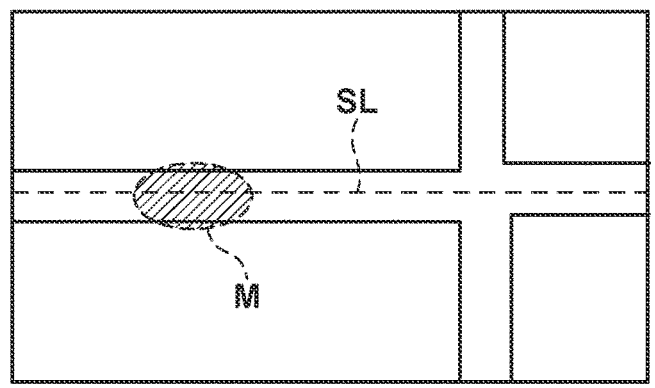
Figure 4C:
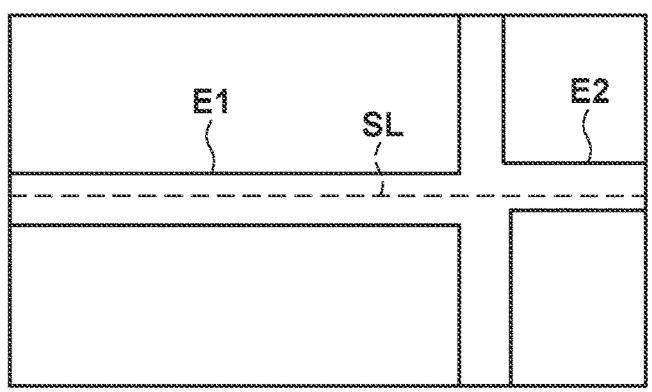

In step S308, the third image in which the stray light M is removed from the scribe line SL as shown in FIG. 4C is obtained by correcting the second image shown in FIG. 4B which is obtained in step S306 with the first image shown in FIG. 4A which is obtained in step S304. The third image indicates the difference between the first image and the second image, and is obtained by general image processing, for example, by subtracting the first image from the second image or dividing the second image by the first image. It becomes possible, by using the third image, to reduce the influence of the stray light M and obtain the position of the scribe line SL accurately.

In step S310, the position of the scribe line SL is obtained based on the third image obtained in step S308, that is, the third image in which the stray light M is removed. More specifically, integration projection is performed on the third image shown in FIG. 4C in the horizontal direction to generate the waveforms, and the position of the scribe line SL is obtained from the peak positions of the waveforms, as described above. However, a process for obtaining the position of the scribe line SL is not limited to integration projection, and may be pattern matching or the like. As will be described later, the process is not limited as long as the rotational shift amount of the chip regions CH1 to CH12 with respect to the notch N can be obtained on the pre-alignment stage.

In step S312, the θ error (rotational shift amount) Mq in the chip regions CH1 to CH12 with respect to the notch N is obtained from the shift amount between the center positions of the second image capturing units 108R and 108L, and the position of the scribe line SL obtained in step S310.

In step S314, based on the θ error Mq obtained in step S312, the substrate W is rotated on the pre-alignment stage to correct the θ position. Here, the θ error Mq obtained in step S312 is determined as the rotational amount (correction value) of the substrate W when the substrate W is transferred from the pre-alignment stage 102 to the substrate stage 114, and the pre-alignment stage 102 is rotated in accordance with the rotational amount. As described above, based on the θ error Mq obtained in step S312, the control unit 118 functions as a determination unit which determines the rotational amount of the substrate W when the substrate W is transferred.

In step S316, the conveyance system 104 transfers the substrate W on which the θ position is corrected by rotating the pre-alignment stage 102 from the pre-alignment stage 102 to the substrate stage 114. As described above, the conveyance system 104 transfers the substrate W from the pre-alignment stage 102 to the substrate stage 114 in a state in which the θ error Mq is reduced, that is, a state in which the substrate W is rotated in step S314. This makes it possible to position the alignment marks AM1 and AM2 which are provided on the substrate W held by the substrate stage 114 within the field of view of the alignment scope 116.

In step S318, the alignment scope 116 detects the alignment marks AM1 and AM2 which are provided on the substrate W held by the substrate stage 114 and based on that detection result, the position of the substrate W with respect to the mask M is corrected (substrate alignment is performed).

In step S320, the pattern image of the mask M is projected on the substrate W via the projection optical system 112, exposing the substrate W.

As described above, the exposure apparatus 1 reduces the influence of the stray light M not by using a representative corrected image for removing the stray light M but by using the first image obtained by capturing the target region on the substrate during detecting the position of the notch N while rotating the substrate W. It is therefore possible to reduce the influence of the stray light M sufficiently even in a case in which the influence of the stray light M changes for each difference in material of the substrate W or orientation of the substrate W held by the pre-alignment stage 102. In addition, the first image for removing the stray light M is obtained during detecting the position of the notch N, neither requiring a special time for obtaining the first image nor decreasing throughput.

In this embodiment, the target object on the substrate which is captured by the second image capturing units 108R and 108L in step S306, and held by the pre-alignment stage 102 is the scribe line SL. However, the present invention is not limited to this. The target object on the substrate may be a mark provided on the substrate, for example, the alignment marks AM1 and AM2, or may be lattices E1 and E2 (see FIG. 4C) of the chip regions CH1 to CH12 or some patterns of the chip regions CH1 to CH12.

Further, in this embodiment, two second image capturing units 108R and 108L are arranged by sandwiching the center of the substrate W. However, there may be only one second image capturing unit when using an image sensor having a number of pixels and capable of capturing (observing) the wide field of view at a high resolution.

<Second Embodiment>

In the first embodiment, when the first image is obtained (step S304), one first image is obtained by capturing the target region on the substrate continuously while rotating the substrate W. On the other hand, in the second embodiment, a plurality of first images are obtained while rotating a substrate W in step S304. For example, the plurality of first images are obtained by capturing a plurality of different regions, respectively, in a target region on the substrate while rotating the substrate W. Note that at least one region out of the plurality of different regions in the target region on the substrate preferably includes a scribe line SL serving as a target object on the substrate.

In step S308, a plurality of third images indicating the difference between the second image and each of the plurality of first images are obtained by correcting the second image obtained in step S306 with each of the plurality of first images obtained in step S304.

In step S310, the contrast of each of the plurality of third images obtained in step S308 is obtained and based on the third image having the highest contrast, the position of the scribe line SL is obtained.

As in the first embodiment, it is also possible to obtain the position of the scribe line SL accurately by reducing the influence of stray light M sufficiently, and to prevent a decrease in throughput.

<Third Embodiment>

In the second embodiment, when the third images are obtained (step S308), the third image indicating the difference from the second image is obtained for each of the plurality of first images obtained in step S304. On the other hand, in the third embodiment, in step S308, a plurality of images obtained in step S304 are averaged to obtain an average image (first image), and an image indicating the difference between the average image and the second image is obtained as the third image by correcting the second image obtained in step S306 with the average image.

As in the first embodiment, it is also possible to obtain the position of a scribe line SL accurately by reducing the influence of stray light M sufficiently, and to prevent a decrease in throughput.

<Fourth Embodiment>

An exposure apparatus 1 is suitable for, for example, manufacturing an article such as a device (semiconductor device, a magnetic storage media, a liquid crystal display element, or the like). The manufacturing method includes a step of forming a pattern on a substrate (that is, exposing the substrate) using the exposure apparatus 1 and a step of processing the substrate (for example, developing the substrate) on which the pattern has been formed. The manufacturing method can also include other known steps (oxidation, deposition, vapor deposition, doping, planarization, etching, resist removal, dicing, bonding, packaging, and the like). The method of manufacturing the article according to this embodiment is superior to a conventional method in at least one of the performance, quality, productivity, and production cost of the article.

Note that a lithography apparatus is not limited to the exposure apparatus, but also includes, for example, an imprint apparatus which performs an imprint process of forming a pattern in an imprint material on the substrate by using a mold or a drawing apparatus which draws a pattern on the substrate with a charged particle beam. A measurement apparatus which includes a pre-alignment stage 102, a first image capturing unit 106, second image capturing units 108R and 108L, and a control unit 118 and measures a θ error in chip regions CH1 to CH12 with respect to a notch N also makes an aspect of the present invention. The present invention is also applicable to an overlay inspection apparatus or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-062488 filed on Mar. 25, 2016, which is hereby incorporated by reference herein in its entirety.

What is claimed is:

1. A measurement method of measuring a rotational shift amount of pattern regions arranged on a substrate with respect to a reference portion provided at an outer edge of the substrate, the method comprising:
   capturing a target region including a target object on the substrate during detecting a position of the reference portion while rotating the substrate to obtain a first image;
   capturing the target object in a state where the substrate remains still to obtain a second image;
   obtaining a third image indicating a difference between the first image and the second image by correcting the second image with the first image; and
   obtaining a position of the target object based on the third image and obtaining the rotational shift amount of the pattern regions with respect to the reference portion based on the obtained position of the target object.

2. The method according to claim 1, wherein the capturing of the target region to obtain the first image obtains the first image by continuously capturing the target region while rotating the substrate.

3. The method according to claim 1, wherein:
   the capturing of the target region to obtain the first image obtains a plurality of first images by capturing a plurality of different regions, respectively, in the target region while rotating the substrate;
   the obtaining of the third image obtains a plurality of third images each indicating a difference between the second image and each of the plurality of first images by correcting the second image with each of the plurality of first images,
   the obtaining of the position of the target image to obtain the rotational shift amount obtains each contrast of the plurality of third images and obtains the position of the target object based on the third image having a highest contrast, among the plurality of third images.

4. The method according to claim 1, wherein the capturing of the target region to obtain the first image obtains an averaged image, as the first image, of a plurality of images by capturing a plurality of different regions, respectively, in the target region while the substrate is being rotated.

5. The method according to claim 3, wherein at least one region, from among the plurality of regions, includes the target object.

6. The method according to claim 1, wherein in the capturing of the target region to obtain the first image, the substrate is rotated at least once.

7. The method according to claim 1, wherein the target object includes at least one of a scribe line defined among the respective pattern regions, a mark provided on the substrate, or some patterns of the pattern regions.

8. The method according to claim 1, wherein the reference portion includes one of an orientation flat or a notch in the substrate.

9. A measurement apparatus that measures a rotational shift amount of pattern regions arranged on a substrate with respect to a reference portion provided at an outer edge of the substrate, the apparatus comprising:
a stage configured to hold and rotate the substrate;
a first image capturing unit configured to capture the outer edge of the substrate;
a second image capturing unit configured to capture a region on the substrate; and
a control unit, including a processor and a memory, configured to;
capture, with the second image capturing unit, a target region including a target object on the substrate during capturing of the outer edge of the substrate with the first image capturing unit to detect a position of the reference portion while the stage rotates the substrate, to obtain a first image;
capture the target object with the second image capturing unit in a state where the substrate remains still to obtain a second image;
obtain a third image indicating a difference between the first image and the second image by correcting the second image with the first image; and
obtain a position of the target object based on the third image and obtain the rotational shift amount of the pattern regions with respect to the reference portion based on the obtained position of the target object.

10. A lithography apparatus that forms a pattern on a substrate, the apparatus comprising:
a pre-alignment stage configured to hold and rotate the substrate;
a substrate stage configured to hold the substrate;
a measurement apparatus configured to measure a rotational shift amount of a pattern regions arranged on the substrate with respect to a reference portion provided at an outer edge of the substrate arranged on the pre-alignment stage, and including:
a first image capturing unit configured to capture the outer edge of the substrate; and
a second image capturing unit configured to capture a region on the substrate;
a control unit, which includes a processor and a memory, configured to:
capture, with the second image capturing unit, a target region including a target object on the substrate during the capturing of the outer edge of the substrate with the first image capturing unit to detect a position of the reference portion while the pre-alignment stage rotates the substrate, to obtain a first image;
capture the target object with the second image capturing unit in a state where the substrate remains still to obtain a second image;
obtain a third image indicating a difference between the first image and the second image by correcting the second image with the first image; and
obtain a position of the target object based on the third image and obtain the rotational shift amount of the pattern regions with respect to the reference portion based on the obtained position of the target object; and
determine, based on the obtained rotational shift amount, a rotational amount of the substrate when the substrate is transferred from the pre-alignment stage to the substrate stage; and
a conveyance system configured to transfer the substrate from the pre-alignment stage to the substrate stage in a state where the substrate is rotated in accordance with the determined rotational amount of the substrate.

11. A method of manufacturing an article, the method comprising:
forming a pattern on a substrate using a lithography apparatus; and
processing the substrate on which the pattern has been formed,
wherein the lithography apparatus includes:
a pre-alignment stage configured to hold and rotate the substrate;
a substrate stage configured to hold the substrate;
a measurement apparatus configured to measure a rotational shift amount of a pattern regions arranged on the substrate with respect to a reference portion which is provided at an outer edge of the substrate arranged on the pre-alignment stage, and including:
a first image capturing unit configured to capture the outer edge of the substrate; and
a second image capturing unit configured to capture a region on the substrate; and
a control unit, which includes a processor and a memory, configured to:
capture, with the second image capturing unit, a target region including a target object on the substrate during capturing of the outer edge of the substrate with the first image capturing unit to detect a position of the reference portion while the pre-alignment stage rotates the substrate, to obtain a first image;
capture the target object with the second image capturing unit in a state where the substrate remains still to obtain a second image;
obtain a third image indicating a difference between the first image and the second image by correcting the second image with the first image;
obtain a position of the target object based on the third image and obtain the rotational shift amount of the pattern regions with respect to the reference portion based on the obtained position of the target object; and
determine, based on the obtained rotational shift amount, a rotational amount of the substrate when the substrate is transferred from the pre-alignment stage to the substrate stage; and
a conveyance system configured to transfer the substrate from the pre-alignment stage to the substrate stage in a state where the substrate is rotated in accordance with the determined rotational amount of the substrate.

\* \* \* \* \*